(12) United States Patent
Foye et al.

(10) Patent No.: US 8,179,157 B2
(45) Date of Patent: May 15, 2012

(54) SETUP AND METHOD FOR TESTING A PERMANENT MAGNET MOTOR

(75) Inventors: David M. Foye, La Crosse, WI (US); Nathan T. West, Holmen, WI (US)

(73) Assignee: Trane International Inc., Piscataway, NJ (US)

( * ) Notice: Subject to any disclaimer, the term of this patent is extended or adjusted under 35 U.S.C. 154(b) by 583 days.

(21) Appl. No.: 12/321,451

(22) Filed: Jan. 21, 2009

(65) Prior Publication Data

US 2010/0182038 A1    Jul. 22, 2010

(51) Int. Cl.
*G01R 31/34*    (2006.01)
(52) U.S. Cl. .................................. 324/765.01
(58) Field of Classification Search ........................ None
See application file for complete search history.

(56) References Cited

U.S. PATENT DOCUMENTS

| 4,363,065 | A |   | 12/1982 | Hasegawa et al. |
| 4,641,066 | A | * | 2/1987  | Nagata et al. ............. 318/400.37 |
| 6,650,122 | B2 |  | 11/2003 | Matthews et al. |
| 7,304,452 | B2 | * | 12/2007 | Nagai et al. .................... 318/811 |
| 7,511,439 | B2 | * | 3/2009  | Bosch et al. ................ 318/254.1 |

FOREIGN PATENT DOCUMENTS

WO    WO 92/20130    11/1992

* cited by examiner

*Primary Examiner* — Paresh Patel
(74) *Attorney, Agent, or Firm* — William O'Driscoll

(57) ABSTRACT

A test setup for a permanent magnet motor provides a method for identifying symmetry or asymmetry in the magnetic fields of the motor's permanent magnets. The setup comprises a test circuit that includes a fixed reference node that provides a stable reference to which the motor's common node can be compared. Observing the waveform of the voltage between the two nodes while the motor is running helps identify an imbalance in the magnetic fields of the motor's permanent magnets.

5 Claims, 1 Drawing Sheet

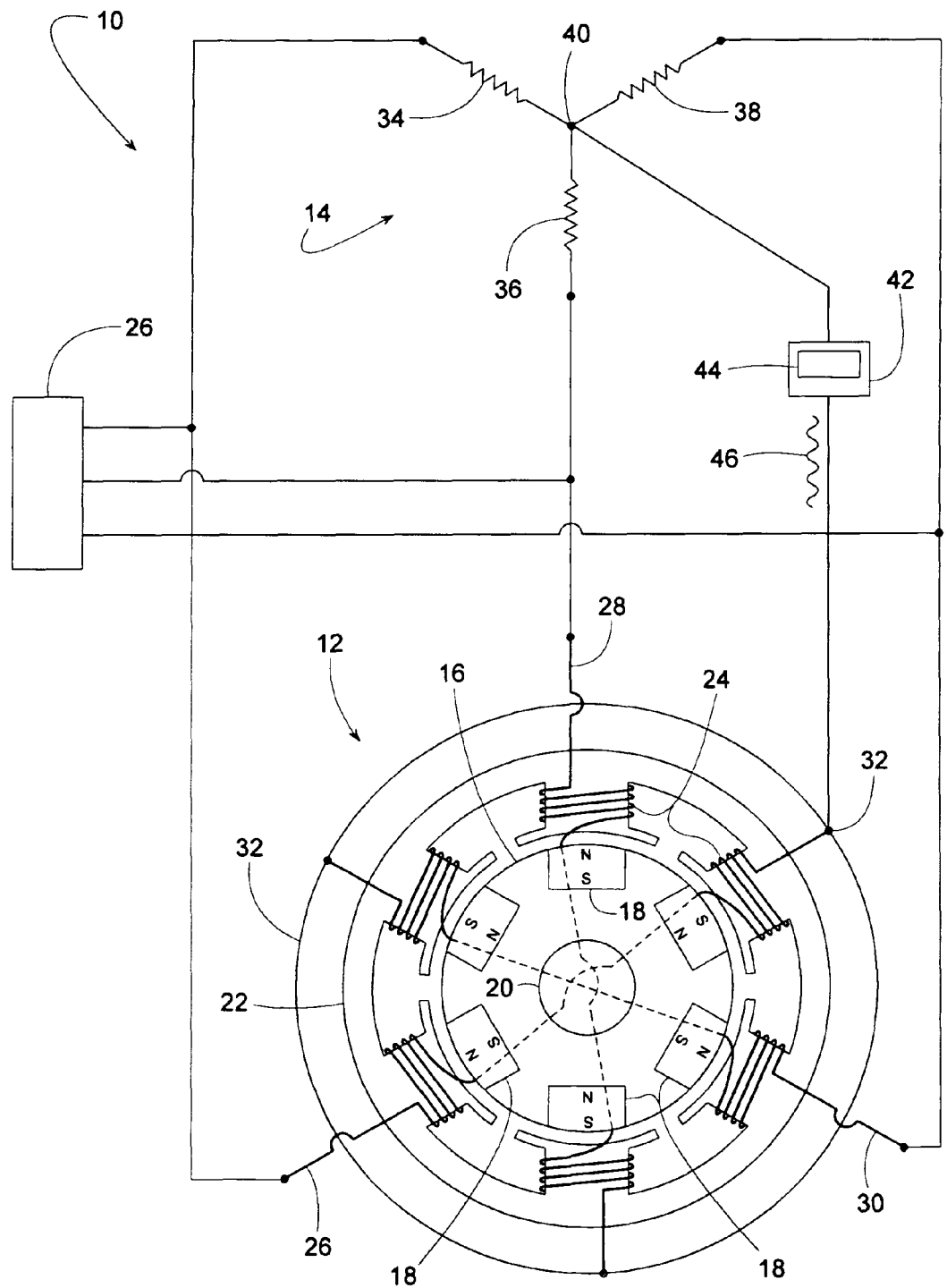

SETUP AND METHOD FOR TESTING A PERMANENT MAGNET MOTOR

FIELD OF THE INVENTION

The subject invention generally pertains to permanent magnet motors and more specifically to a setup and method for testing and/or monitoring such a motor.

BACKGROUND OF RELATED ART

Permanent magnet motors, such as brushless DC motors and stepper motors, typically include multiple permanent magnets each having a magnet field that interacts with multiple electrical coils to rotate a rotor within a stator. Some permanent magnet motors have the magnets on the rotor with the coils in the stator, and others have the magnets in the stator with the coils being part of the rotor. In either case, it may be desirable to check the symmetry of the magnetic fields of the permanent magnets to ensure proper, smooth operation of the motor. Checking magnetic field symmetry; however, can be difficult to do, particularly after the motor is assembled and operating.

SUMMARY OF THE INVENTION

It is an object of the present invention to provide a setup and method for testing and/or monitoring a permanent magnet motor.

Another object of some embodiments is to check the symmetry or asymmetry of the magnetic fields provided by a plurality of magnets of a permanent magnet motor.

Another object of some embodiments is to check the symmetry or asymmetry of the magnetic fields as the motor is energized and running.

Another object of some embodiments is to check the symmetry or asymmetry of a permanent magnet motor's magnetic fields by comparing the voltage, current, and/or waveform of the motor's common node relative to a fixed reference node of an external test circuit.

Another object of some embodiments is to measure the imbalance of a motor's magnetic field, wherein the measured imbalance can be used, depending on rotor design, to monitor rotor conditions due to variations in mechanical, thermal, or magnetic operating parameters. The imbalance may be deliberately introduced in the rotor design to allow this monitoring.

One or more of these and/or other objects of the invention are provided by a motor test setup comprising a test circuit and a permanent magnet motor. The test circuit includes a fixed reference node that provides a reference to which the motor's common node can be compared. An instrument sensing the voltage, for example, between the two nodes helps identify an imbalance in the magnetic fields of the motor's permanent magnets.

BRIEF DESCRIPTION OF THE DRAWINGS

FIG. 1 is a schematic diagram illustrating a method and setup for testing and/or monitoring a permanent magnet motor.

DESCRIPTION OF THE PREFERRED EMBODIMENT

FIG. 1 schematically illustrates a motor test setup 10 with one example of a permanent magnet motor 12 connected to a test circuit 14 for detecting and evaluating an imbalance or asymmetry in the magnetic field of the motor's permanent magnets. The expression, "permanent magnet motor" means any electromotive rotational machine that includes at least one permanent magnet having a magnet field interacting with the magnet field of an electric coil. The permanent magnet could be attached to the rotor with the coil being stationary, as shown in the example, or the magnet could be stationary with the coil rotating with the rotor. Examples of a permanent magnet motor include, but are not limited to, a brushless DC motor and a stepper motor. More specific examples of motor 12 include TK-85 and TK-106 series motors by PHASE Motion Control of Italy. For the example illustrated in FIG. 1, motor 12 happens to be a brushless DC motor with a rotor 16 having a plurality of permanent magnets 18; however, other types of permanent magnet motors with any number of magnets and any number of coils can also be tested using the method described and illustrated here.

Referring to FIG. 1, motor 12 comprises a rotatable shaft 20 supporting rotor 18 within a stator 22. Magnets 18 of rotor 16 are elongate in a direction generally parallel to shaft 20. The magnetic poles of magnets 18 run generally radially with the north/south poles alternating from one magnet to the next. Stator 22 comprises a plurality of coils 24 that when sinusoidally or strategically energized by a polyphase power source 26 provide an electrically induced magnetic field that interacts with the magnet fields of magnets 18 urge rotor 16 to rotate within stator 22. The phrase, "strategically energized," refers to a waveform that is something other than purely sinusoidal. Such strategic energizing of a motor can be provided, for instance, by a PWM electronic power converter. Power source 26 can be a 3-phase system or some other polyphase power source (e.g., 2-phase, 4-phase, 5-phase, etc.).

To connect motor 12 to power source 26, the coils of stator 22 include a first electrical lead 26, a second electrical lead 28 and a third electrical lead 30 that can be wired to power source 26. Also, coils 24 share a common node 32. Under normal, non-test operation, node 32 might be grounded or left as a floating ground.

To test or monitor the magnetic field imbalance of motor 12, test circuit 14 comprises a first resistor 34, a second resistor 36 and a third resistor 38 that are wired respectively to leads 26, 28 and 30, whereby power source 26 energizes motor 12 and test circuit 14 in a similar manner. Resistors 34, 36 and 38 share a reference node 40 that provides a reference point to which common node 32 can be compared when power source 26 energizes motor 12 and circuit 14. Resistors 34, 36 and 38 preferably are of equal resistance with a resistance value suitable for the power source. An appropriate resistor size for a 480-volt system, for example, would be about 1 megohm.

An instrument 42 connected to reference node 40 and common node 32 is able to detect a differential electrical signal 46 between nodes 32 and 40, wherein signal 46 reflects how well the plurality of magnet fields of magnets 18 are balanced or similar to each other. Instrument 42 can be any device capable of sensing an electrical difference between nodes 32 and 40. Examples of instrument 42 include, but are not limited to, an oscilloscope, a voltmeter, an ammeter, etc. Examples of differential electrical signal 46 include, but are not limited to, voltage between nodes 32 and 40 or electrical current between nodes 32 and 40.

A displayed reading 44 of instrument 42 can show the actual waveform of signal 46, wherein signal 46 varies cyclically as rotor 16 rotates, or reading 44 can perhaps be a substantially constant output value such as an RMS value of signal 46. Instrument 42 displaying a sinusoidal waveform having a peak voltage or current amplitude that is substantially constant (i.e., each peak has substantially the same amplitude) can indicate that the magnetic fields of rotor 16 are substantially symmetrical. If a generally sinusoidal waveform of differential electrical signal 46 has a peak amplitude that varies cyclically as rotor 16 rotates, that could indicate an asymmetry or an imbalance in the rotor's magnetic fields.

In the proposed possible case where instrument 42 displays an RMS value of signal 46, an RMS value of zero could indicate that the rotor's magnetic fields are substantially symmetrical or balanced. An RMS value other than zero could indicate appreciable asymmetry with the amplitude of the RMS value reflecting the magnitude of the asymmetry. The motor system can include triplen and other harmonics depending on motor design which result in nonzero differential signals and can be used for monitoring. In some cases, a predefined acceptable range of differential electrical signal 46 would be where the asymmetry is appreciably greater than zero (i.e., not perfectly symmetrical) but less than a predetermined upper limit. In such cases, motor 12 would be considered acceptable for normal use if signal 46 was within the predefined acceptable range, but motor 12 would be considered unacceptable for normal use if signal 46 was beyond the predefined acceptable range (i.e., greater or less than the predefined acceptable range). The expression, "normal use" refers to a motor fully functioning as it was originally designed to operate. It should be noted that the terms "symmetrical" and "balanced" are used interchangeably throughout the description of the invention. Likewise, the terms, "asymmetrical" and "imbalanced" are also used synonymously.

Although the invention is described with respect to a preferred embodiment, modifications thereto will be apparent to those of ordinary skill in the art.

The scope of the invention, therefore, is to be determined by reference to the following claims:

1. A method for testing a permanent magnet motor, wherein the permanent magnet motor includes a stator having a plurality of coils that share a common node; a first electrical lead, a second electrical lead, and a third electrical lead, all of which are wired to the plurality of coils and are adapted for connection to a polyphase power source; a rotor having a plurality of permanent magnets providing a plurality of magnetic fields; and a rotatable shaft supporting the rotor within the stator; the method comprising:

wiring a first resistor, a second resistor, and a third resistor respectively to the first electrical lead, the second electrical lead, and the third electrical lead, wherein the first resistor, the second resistor and the third resistor share a reference node;

energizing the permanent magnet motor via the polyphase power source;

sensing a differential electrical signal between the reference node and the common node;

detecting an imbalance of the plurality of magnetic fields based on the differential electrical signal; and defining an acceptable range of the differential electric signal, wherein the differential electrical signal being beyond the acceptable range indicates that the plurality of magnetic fields are appreciably imbalanced and that the permanent magnet motor is unacceptable for normal use.

2. The method of claim 1, wherein the differential electrical signal is a voltage signal.

3. The method of claim 1, wherein the differential electrical signal is a current signal.

4. The method of claim 1, wherein the differential electrical signal varies as the rotor rotates.

5. The method of claim 1, wherein the first resistor, the second resistor and the third resistor are of substantially equal resistance.

\* \* \* \* \*